US009264218B2

(12) United States Patent
Meng

(10) Patent No.: US 9,264,218 B2
(45) Date of Patent: Feb. 16, 2016

(54) RISING AND FALLING EDGE DETECTION AND RE-ASSEMBLY FOR HIGH SPEED SERIAL DATA COMMUNICATIONS

(71) Applicant: Lenovo Enterprise Solutions (Singapore) Pte. Ltd., Singapore (SG)

(72) Inventor: Jian Meng, Kanata (CA)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/301,190

(22) Filed: Jun. 10, 2014

(65) Prior Publication Data

US 2015/0358150 A1 Dec. 10, 2015

(51) Int. Cl.
*H04B 1/10* (2006.01)
*H04L 7/04* (2006.01)

(52) U.S. Cl.
CPC ........................................ *H04L 7/04* (2013.01)

(58) Field of Classification Search
CPC ....................................................... H04L 7/04
See application file for complete search history.

(56) References Cited

U.S. PATENT DOCUMENTS

| 6,765,973 | B1 * | 7/2004 | Miller ..................... H03L 7/091 375/354 |
| 7,221,295 | B2 | 5/2007 | Carley |
| 7,366,267 | B1 | 4/2008 | Lee et al. |
| 7,543,209 | B2 | 6/2009 | Bonneau et al. |
| 2004/0258328 | A1* | 12/2004 | Adler ................... A61B 5/1076 382/286 |
| 2005/0108600 | A1 | 5/2005 | Arguelles |
| 2005/0286643 | A1* | 12/2005 | Ozawa .................... H03L 7/087 375/242 |
| 2010/0220828 | A1* | 9/2010 | Fuller ................. H03F 3/45179 375/355 |
| 2012/0027133 | A1* | 2/2012 | Raman ................. G01S 19/246 375/340 |
| 2012/0176159 | A1 | 7/2012 | Webb et al. |
| 2012/0189086 | A1 | 7/2012 | Cai et al. |
| 2014/0016718 | A1 | 1/2014 | Ravinuthula et al. |
| 2015/0098538 | A1* | 4/2015 | Wiley ..................... H04L 1/205 375/355 |

FOREIGN PATENT DOCUMENTS

JP 2012156776 8/2012

* cited by examiner

*Primary Examiner* — Erin File
(74) *Attorney, Agent, or Firm* — Zilka-Kotab, PC

(57) ABSTRACT

A method according to one embodiment includes receiving a serialized data stream; detecting rising and falling edges in the serialized data stream; correlating the rising and falling edges to data values using a clock signal that is not derived from the serialized data stream; and converting the serialized data stream to a parallel data stream. In a further embodiment a system includes a processor and logic integrated with and/or executable by the processor. The logic is configured to receive a serialized data stream; detect rising and falling edges in the serialized data stream; correlate the rising and falling edges to data values using a clock signal that is not derived from the serialized data stream; and convert the serialized data stream to a parallel data stream.

20 Claims, 9 Drawing Sheets

RISING AND FALLING EDGE DETECTION AND RE-ASSEMBLY FOR HIGH SPEED SERIAL DATA COMMUNICATIONS

BACKGROUND

The present invention relates to communication systems, and more specifically, this invention relates to edge detection for high speed serial data communications.

Current high speed serial links of chip to chip and board to board data transfers are limited in their potential degree of signal integrity due to the fact that they rely on clock recovery of incoming serial data. This proves to be limiting especially in environments with high signal interference/noise due to the fact that current data transmission requires a high degree of signal integrity.

BRIEF SUMMARY

A method according to one embodiment includes receiving a serialized data stream; detecting rising and falling edges in the serialized data stream; correlating the rising and falling edges to data values using a clock signal that is not derived from the serialized data stream; and converting the serialized data stream to a parallel data stream.

A system according to one embodiment includes a processor and logic integrated with and/or executable by the processor. The logic is configured to receive a serialized data stream; detect rising and falling edges in the serialized data stream; correlate the rising and falling edges to data values using a clock signal that is not derived from the serialized data stream; and convert the serialized data stream to a parallel data stream.

A computer program product, according to one embodiment includes a computer readable storage medium having program instructions embodied therewith, the program instructions readable and or executable by a device to cause the device to perform a method including: receiving a serialized data stream; detecting rising and falling edges in the serialized data stream; correlating the rising and falling edges to data values using a clock signal that is not derived from the serialized data stream; and converting the serialized data stream to a parallel data stream.

Other aspects and embodiments of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and the include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of systems, methods and computer program products for edge detection and re-assembly in high speed serial data communications.

In one general embodiment, a method includes receiving a serialized data stream; detecting rising and falling edges in the serialized data stream; correlating the rising and falling edges to data values using a clock signal that is not derived from the serialized data stream; and converting the serialized data stream to a parallel data stream.

In another general embodiment, a system includes a processor and logic integrated with and/or executable by the processor. The logic is configured to receive a serialized data stream; detect rising and falling edges in the serialized data stream; correlate the rising and falling edges to data values using a clock signal that is not derived from the serialized data stream; and convert the serialized data stream to a parallel data stream.

In another general embodiment, a computer program product includes a computer readable storage medium having program instructions embodied therewith, the program instructions readable and or executable by a device to cause the device to perform a method including: receiving a serialized data stream; detecting rising and falling edges in the serialized data stream; correlating the rising and falling edges to data values using a clock signal that is not derived from the serialized data stream; and converting the serialized data stream to a parallel data stream.

Figure 1:
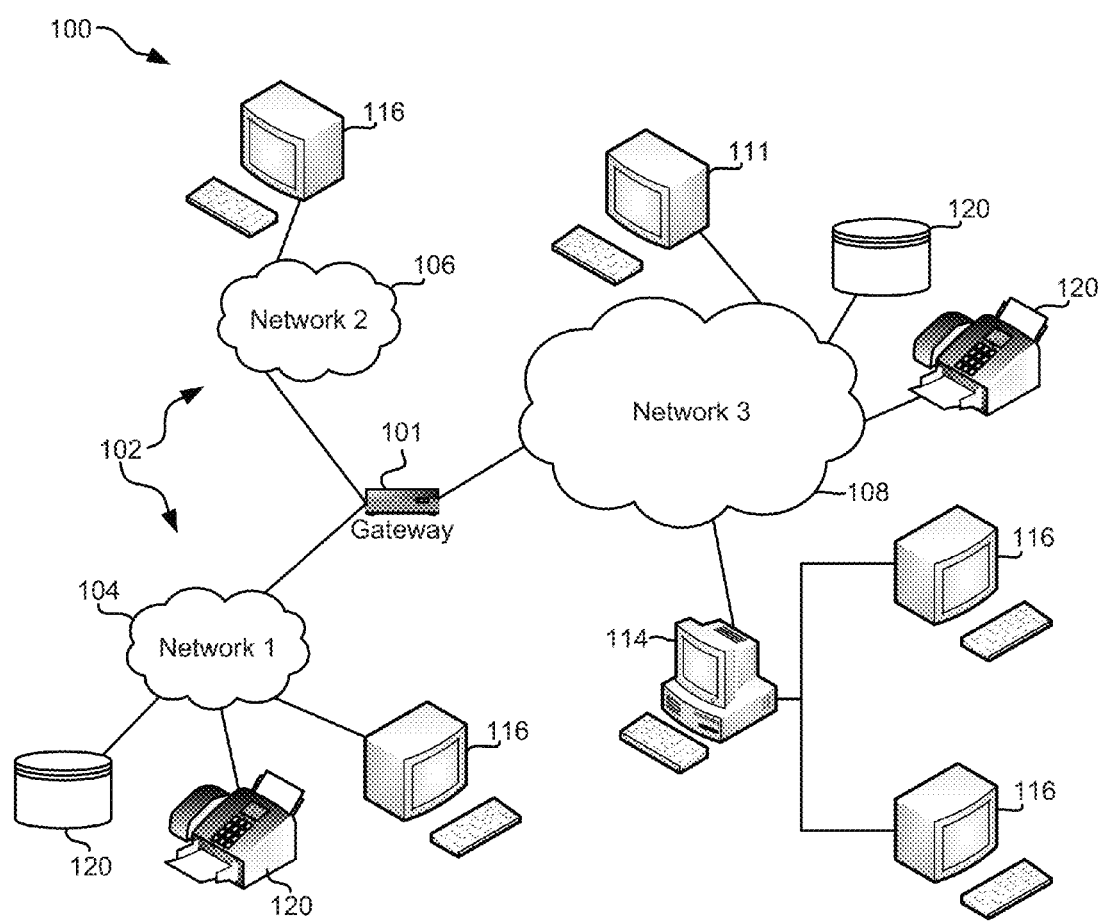
FIG. 1 illustrates a network architecture, in accordance with one embodiment.

FIG. 1 illustrates an architecture 100, in accordance with one embodiment. As shown in FIG. 1, a plurality of remote networks 102 are provided including a first remote network 104 and a second remote network 106. A gateway 101 may be coupled between the remote networks 102 and a proximate network 108. In the context of the present architecture 100, the networks 104, 106 may each take any form including, but not limited to a LAN, a WAN such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. Such user devices 116 may include a desktop computer, lap-top computer, hand-held computer, printer or any other type of logic. It should be noted that a user device 111 may also be directly coupled to any of the networks, in one embodiment.

A peripheral 120 or series of peripherals 120, e.g., facsimile machines, printers, networked and/or local storage units or systems, etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX system which emulates an IBM z/OS environment, a UNIX system which virtually hosts a MICROSOFT WINDOWS environment, a MICROSOFT WINDOWS system which emulates an IBM z/OS environment, etc. This virtualization and/or emulation may be enhanced through the use of VMWARE software, in some embodiments.

In more approaches, one or more networks 104, 106, 108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used.

Figure 2:
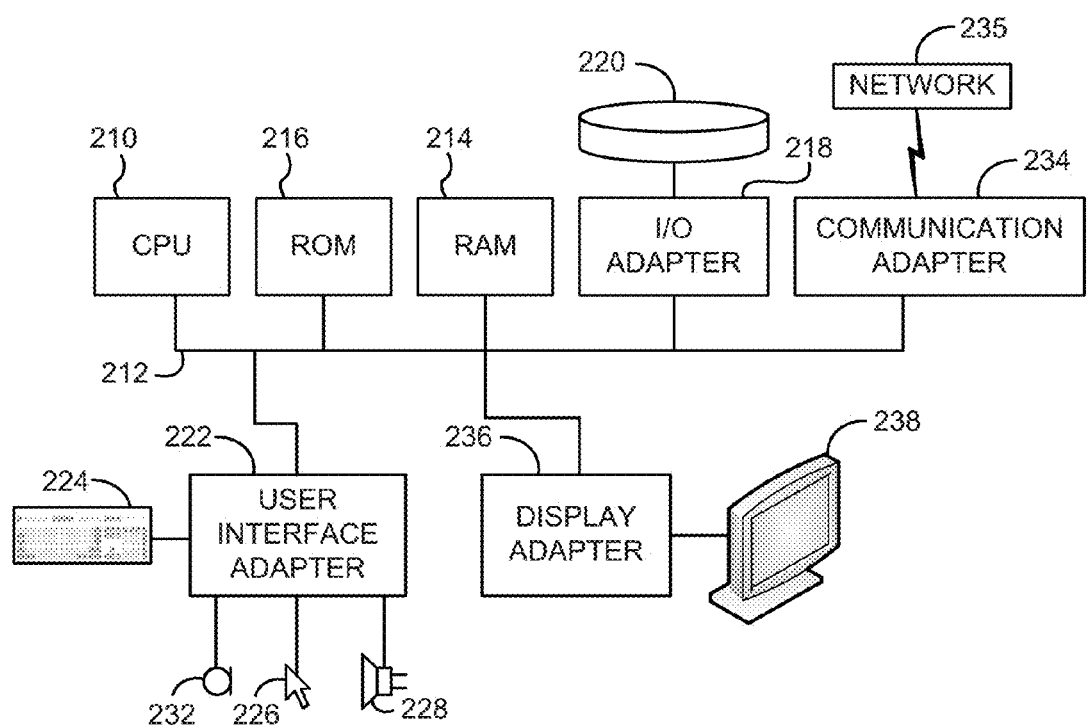
FIG. 2 shows a representative hardware environment that may be associated with the servers and/or clients of FIG. 1, in accordance with one embodiment.

FIG. 2 shows a representative hardware environment associated with a user device 116 and/or server 114 of FIG. 1, in accordance with one embodiment. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an I/O adapter 218 for connecting peripheral devices such as disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft Windows® Operating System (OS), a MAC OS, a UNIX OS, etc. It will be appreciated that a preferred embodiment may also be implemented on platforms and operating systems other than those mentioned. A preferred embodiment may be written using XML, C, and/or C++ language, or other programming languages, along with an object oriented programming methodology. Object oriented programming (OOP), which has become increasingly used to develop complex applications, may be used.

As briefly described above, conventional high speed data communication systems experience losses due to the fact that they rely on clocks recovered from incoming serial data. Furthermore, in complex systems and/or noisy environments which limit the accuracy of clock recovery of incoming serial data, conventional clock recovery systems are very sensitive to the positions of clock edges recovered from the data received. Poorly recovered clock edges (also known as waveform jitter) additionally negatively affect clock data recovery (CDR), as well as the bit error ratio (BER) performance of the high speed serial links.

It may also be noted that in systems with higher data speeds e.g. 10 Gbps, 25 Gbps, 40 Gbps, 100 Gbps, etc. conventional high speed data communication systems require expensive printed circuit boards (PCBs)/chip devices, in order to maintain sufficient signal integrity on the receiving portion. These limiting factors negatively impact both data rates as well as the range capabilities of data transmission.

Various approaches described herein utilize a Serializer/Deserializer (SerDes) technology based on rising and falling edge detection and reassembly on high speed serial data communication systems rather than the above described conventional clock which is recovered from serial data received. Note that edge detection may be performed by an edge detector of a type known in the art. A SerDes is a pair of functional blocks commonly used in high speed data communications to compensate for limited input/output. These blocks convert data between serial data and parallel interfaces. This idea is a viable solution to the numerous conventional problems described above, with numerous advantages which will be described in detail below, most notably achieving accurate data transmission, even in situations with limited and/or jittery inputs/outputs.

Figure 3A:
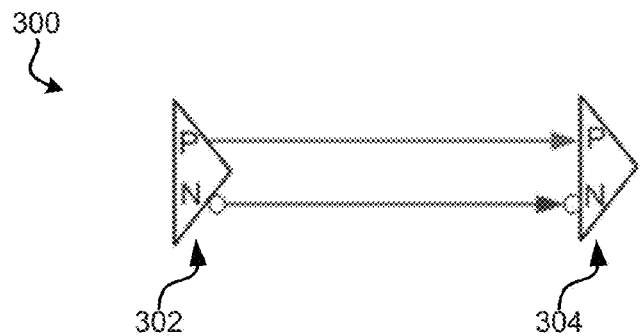
FIG. 3A illustrates a system according to one embodiment.
Figure 3B:
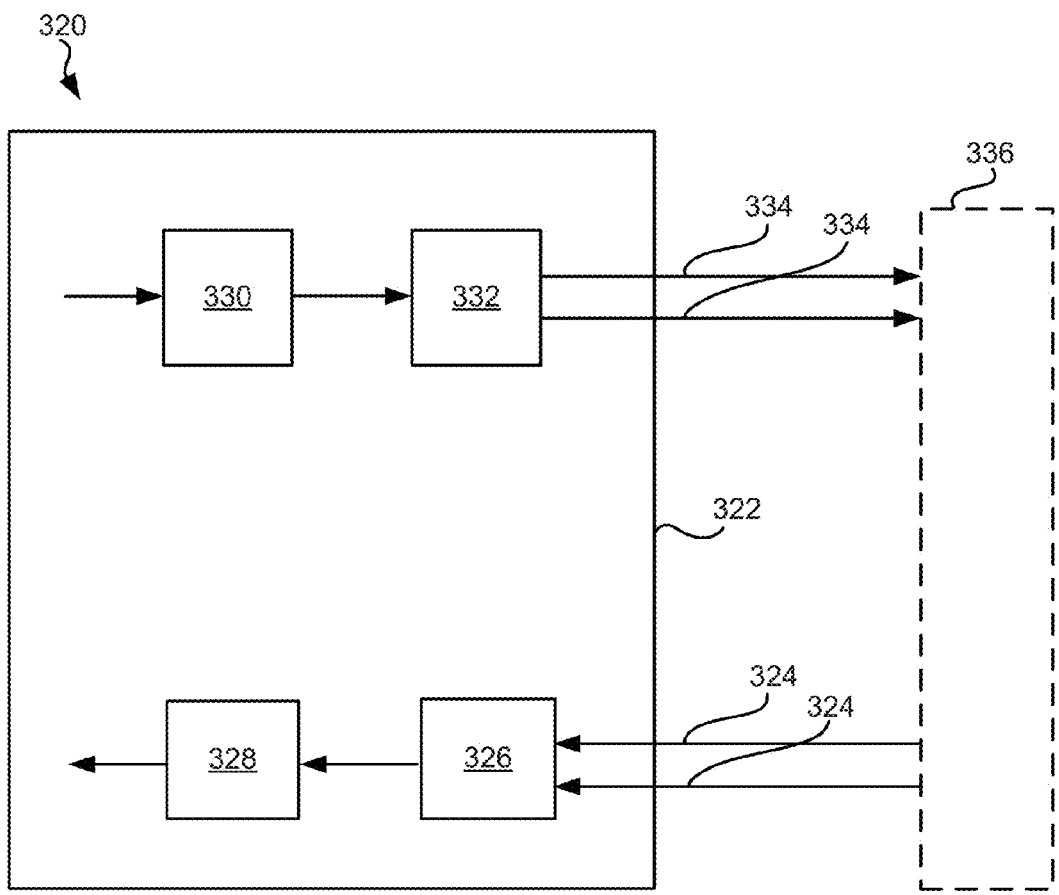
FIG. 3B illustrates a system according to one embodiment.

FIG. 3A-3B depict systems 300, 320, in accordance with illustrative embodiments. As an option, the present systems 300, 320 may be implemented in conjunction with features from any other embodiment listed herein, such as those described with reference to the other FIGS. Of course, however, such systems 300, 320 and others presented herein may be used in various applications and/or in permutations which may or may not be specifically described in the illustrative embodiments listed herein. Further, the systems 300, 320 presented herein may be used in any desired environment.

FIG. 3A illustrates a system 300 in which two devices are conducting high speed serial data communications with one another. System 300 includes a data transmission portion 302 and a data receiving portion 304. Data transmission often requires data serializing/deserializing, as will be described below.

Referring now to FIG. 3B, system 320 includes a circuit board 322, which receives a serialized data stream from a serial link having differential inputs 324 and differential outputs 334. The serial link may be of a module 336 that the circuit board 322 (e.g. of a computer, processing device, etc.) is communicating with. After the differential serial input buffer 326 receives a serialized data stream, the data may be converted from a serial data stream to a parallel data stream in the serial to parallel converter 328. The parallel data stream may then be processed by processing circuitry of the circuit board 322.

Similarly, a parallel data stream may be sent from the circuit board 322 to the module 336 via a parallel to serial converter 330. Differential serial output buffer 332 receives the serialized data stream from the converter 330, and may output it to a serial link with differential outputs 334 and in communication with the module 336.

An example of the above described system 320 includes a computer (336 in this example) sending a serialized data stream to a card (e.g. graphics, processor, etc.) (322 in this example). The serialized data stream from the computer is processed in the differential serial input buffer 326 and output to the serial to parallel converter 328. A SerDes system may perform the above described data reception as well as the clock edge detection required to do so, utilizing the method 400 and further embodiments described below.

Figure 4:
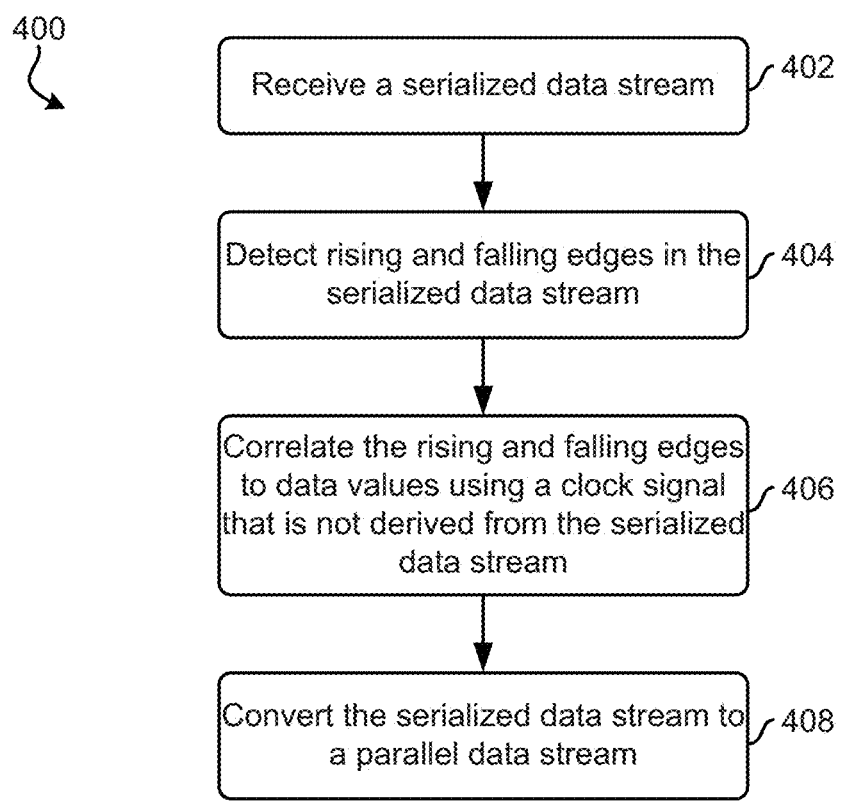
FIG. 4 is a flowchart of a method according to one embodiment.

Referring now to FIG. 4, a flowchart of a method 400 is shown according to one embodiment. The method 400 may be performed in accordance with the present invention in any of the environments depicted in any of the figures, among others, in various embodiments. Of course, more or less operations than those specifically described in FIG. 4 may be included in method 400, as would be understood by one of skill in the art upon reading the present descriptions.

Each of the steps of the method 400 may be performed by any suitable component of the operating environment. For example, in various embodiments, the method 400 may be partially or entirely performed by one or more processors, or some other device having one or more processors therein. The processor, e.g., processing circuit(s), chip(s), and/or module(s) implemented in hardware and/or software, and preferably having at least one hardware component may be utilized in any device to perform one or more steps of the method 400. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 4, method 400 may initiate with operation 402, where a serialized data stream is received. As described above, a serialized data stream may be received from a serial link having differential inputs (see 324 of FIG. 3B). In operation 404, the rising and falling edges in the serialized data stream are detected using known or future methods.

Looking to operation 406, the rising and falling edges are correlated to data values, using a clock signal that is not derived from the serialized data stream. Rather than deriving the clock signal from the serialized data stream, the clock signal may be derived from a local clock according to one embodiment. In further embodiments, the clock signal may be derived from a clock on a remote device sending the serialized data stream. Examples of these illustrative embodiments will now be described below.

Figure 5A:
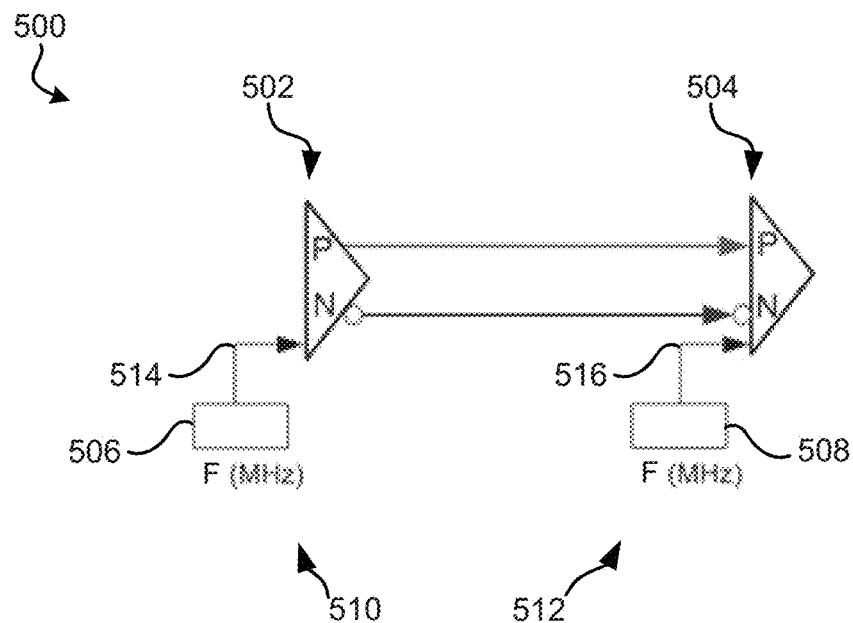
FIG. 5A illustrates a local clock source configuration according to one embodiment.
Figure 5B:
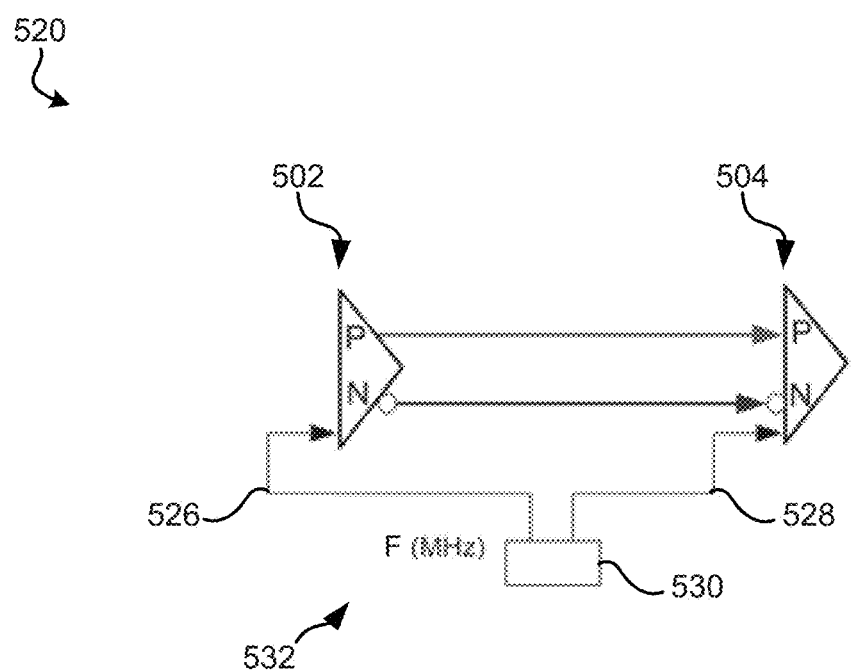
FIG. 5B illustrates a common clock source configuration according to one embodiment.

FIGS. 5A-5B depict clock source configurations 500, 520 in accordance with various embodiments. As an option, the present clock source configurations 500, 520 may be implemented in conjunction with features from any other embodiment listed herein, such as those described with reference to the other FIGS. Of course, however, such clock source configurations 500, 520 and others presented herein may be used in various applications and/or in permutations which may or may not be specifically described in the illustrative embodiments listed herein. Further, the clock source configurations 500, 520 presented herein may be used in any desired environment.

Clock source configuration 500 of FIG. 5A includes local source reference clocks 506 and 508. Local source reference clocks 506 and 508 have clock outputs 514 and 516 into the serializer/deserializer (herein referred to as SerDes) transmitter portion 502 and SerDes receiver portion 504 (respectively). The clock outputs 514 and 516 may differ by a tolerance e.g. of up to +/−100 ppm (parts per million) but could be higher or lower depending on the embodiment. It should be noted that the frequencies 510 and 512 of the SerDes transmitter portion 502 and SerDes receiver portion 504 are substantially the same, e.g. F MHz as illustrated in FIG. 5A, but could be higher or lower matched frequencies depending on the embodiment. The clocks 506, 508 may be individually set to have substantially the same clock period. In other approaches, the clocks may be synchronized. For example, a preamble, pre-set, handshake, etc. may be sent from the transmitter portion to the receiver portion in order to initially correlate matched clock speeds.

Referring now to FIG. 5B, clock source configuration 520 includes a SerDes transmitter portion 502 and a SerDes receiver portion 504. Clock source configuration 520 further includes a common source reference clock 530 (e.g., oscillator), which outputs the same clock signal to the SerDes transmitter portion 502 and SerDes receiver portion 504.

Remote devices may share the same circuit board, be implemented on the same computer system, compose a device together, etc. or may be on separate devices with a physical boundary between them, depending on the embodiment.

According to various embodiments, the SerDes transmitter portions (see 502 of FIGS. 5A-5B) output serial data onto serial links (differential pairs on PCB, direct attached cables (DACs), fiber optic cables, etc.). Output of serial data may be done so logically (e.g. voltage), optically, via a frequency transmission, etc., depending on the embodiment. Additionally, there may be no tight waveform jitter requirements on the waveforms transmitted.

The clock outputs 526 and 528 may differ by a tolerance, e.g. of up to +/−100 ppm (parts per million) but could be higher or lower depending on the embodiment. It should be noted that the frequency 532 of the SerDes transmitter portion 502 and SerDes receiver portion 504 are substantially the same, e.g. F MHz as illustrated in FIG. 5B, but could be a higher or lower frequency 532 depending on the embodiment.

Referring again to method 400 of FIG. 4, in operation 408, the serialized data stream is converted to a parallel data stream. For example, as described in FIG. 3B, the serialized data stream may be converted to a parallel data stream in a converter (see 328 of FIG. 3B). All other method operations 402, 404, 406 may occur in a differential serial input buffer 326 (FIG. 3B), as described above.

Figure 6:
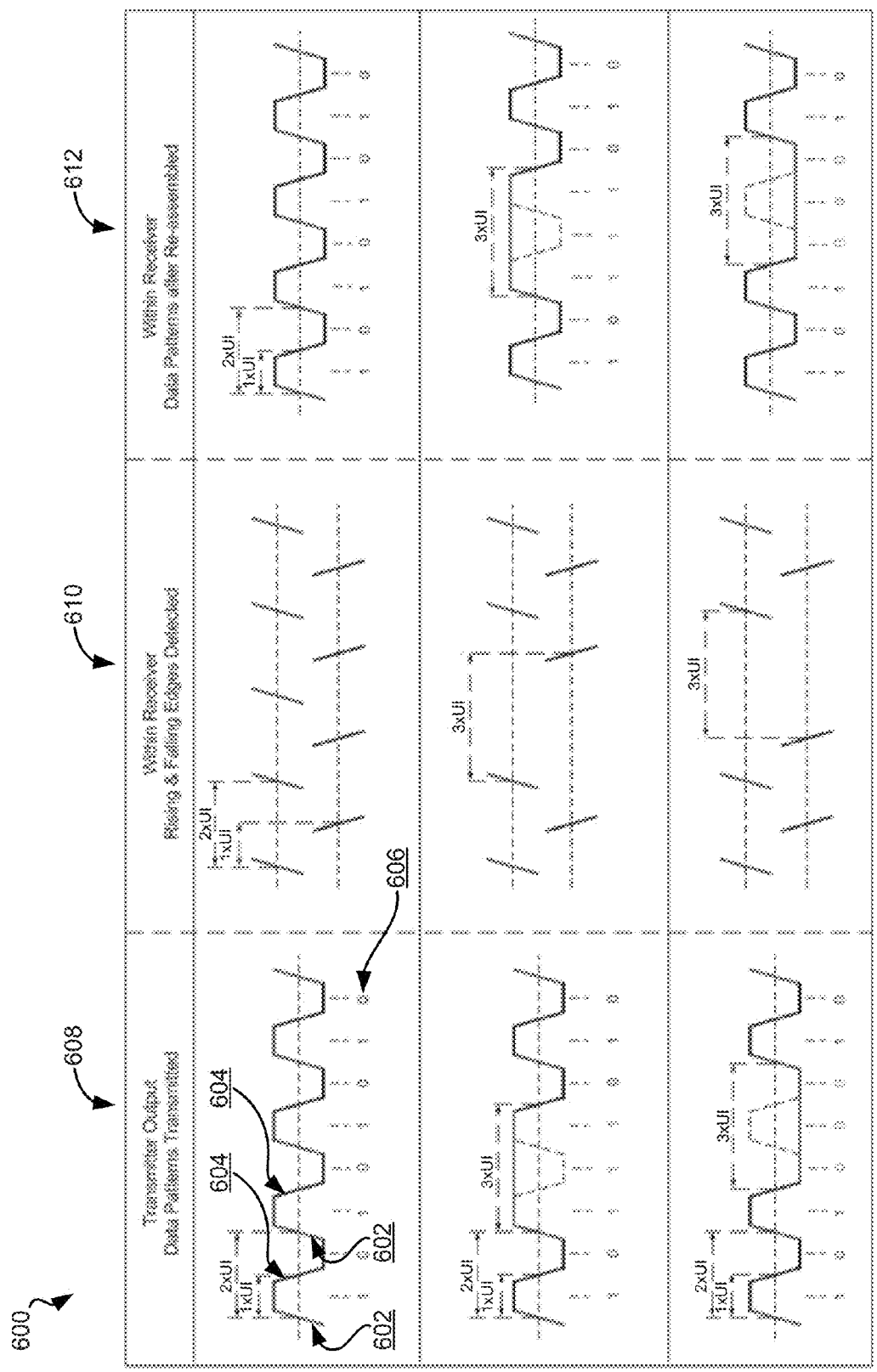
FIG. 6 illustrates a graphical representation of data signals according to one embodiment.

FIG. 6 depicts a graphical representation of data signals 600, in accordance with one embodiment. As shown, the graphical representation of data signals 600 illustrates the rising edges 602 and falling edges 604 of data signals 600. The graphical representation of data signals 600 includes data signals 608 output from the transmitter, data signal edge detection 610 at the receiver, and data signal re-assembly 612 into a data pattern. The time periods between rising edges 602 and falling edges 604 of data signals 600 may be correlated to data values 606 (e.g. "1" or "0"). These data values may be recorded, displayed, output, etc. as will be described in further embodiments below. For example, the data patterns 612 obtained after reassembly may be stored in logic for processing and/or use by the receiving system in any known manner.

Correlation of the rising and falling edges 602, 604 to data values 606 according to one embodiment assumes that a rising edge is followed by a falling edge, and that there will never be two or more consecutive rising edges on a normal serial data communications. Likewise, a falling edge is followed by a rising edge; there will never two or more consecutive falling edges on a normal serial data communications.

The data value or values 606 are 1's if the transition of signal is from rising edge to falling edge. Similarly, the data value or values 606 are 0's if the transition of signal is from falling edge to rising edge. Note that the data values could be reversed in various implementations, i.e., rising to falling edges correlates to one or more 0's while falling to rising edges correlates to one or more 1's. In such embodiments, known techniques and/or modifications may be implemented in order to reverse the data values.

Correlation of the rising and falling edges 602, 604 to data values 606 includes determining a time period between the detected edges, i.e., between a rising edge 602 and falling edge 604, and vice versa. Each period corresponds to one or a plurality of predefined intervals, and will herein be referred to as "UI" (unit interval) as illustrated in FIG. 6. The UI may be derived in the receiver from some clock signal that is not derived from the serialized data stream. Examples of sources of such clock signal are described elsewhere herein, e.g., with reference to FIGS. 5A and 5B. Note that the UI on the sending side is substantially the same as on the receiving side.

The number of data values corresponding to a rising/falling edge pair is dependent upon the number of UIs in the period therebetween, each UI corresponding to one data value. For example, as labeled in FIG. 6, when the period between a rising edge 602 and falling edge 604 is 1×UI, the corresponding data value 606 is a single 1. When the period between a rising edge 602 and the immediately following falling edge 604 is 3×UI, the corresponding data values are three 1's. Likewise, when the period between a falling edge 604 and the immediately following rising edge 602 is 3×UI, the corresponding data values are three 0's.

Figure 7:
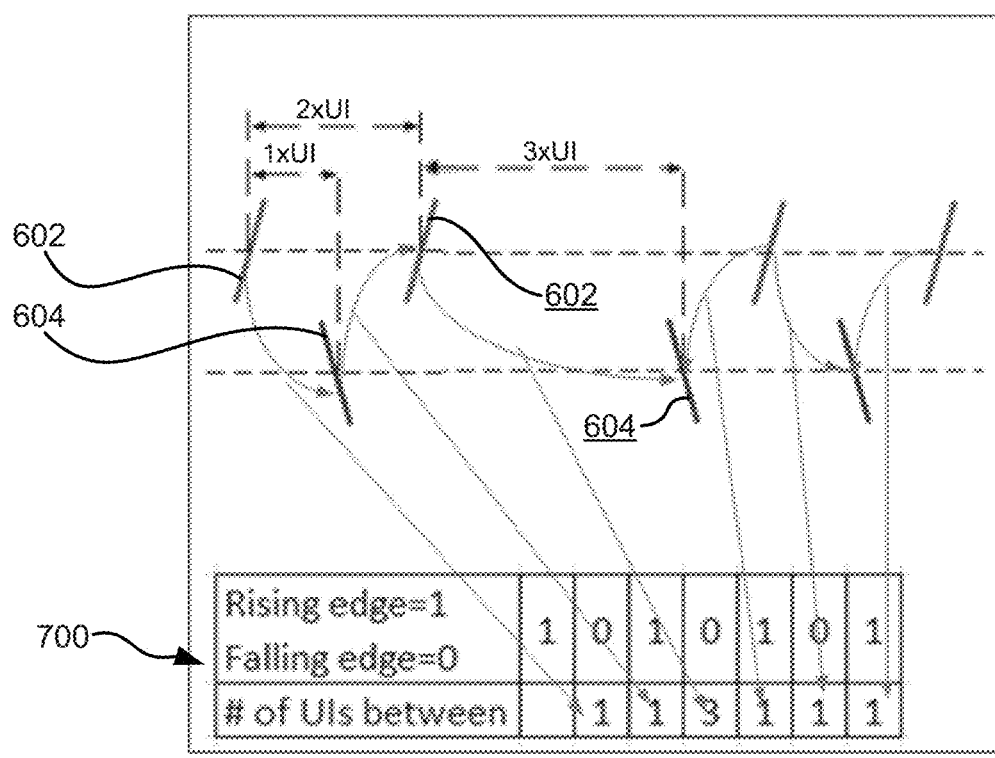
FIG. 7 illustrates a storing table of data signal edges according to one embodiment.

To further illustrate the foregoing, FIG. 7 depicts a table 700, in accordance with one embodiment. Table 700 of FIG. 7 stores the types of edges, rising 602 and falling 604, and the number of intervals (UI) between the edges 602 and 604 in edge detection. The SerDes receiver may count the number of UIs between edges 602 and 604 using a local reference clock or other clock signal not derived from the serialized data stream. Furthermore, corresponding data values may be saved into table 700 sequentially; the table structure may be similar to a FIFO buffer.

The table 700, or similar data collection, may be used to deserialize a data stream. As illustrated in table 700, rising edges 602 may be stored as a logical value of "1", and falling edges 604 may be stored as a logical value of "0". Additionally, table 700 contains the number of intervals (UI) between the edges 602, 604, e.g. 1×U1, 2×U1, 3×U1, etc., which indicates the number of intervals (UI), e.g. 1, 2, 3, etc. between a rising edge 602 and a falling edge 604 of a data signal, and vice versa. For example, between the rising edge 602 and falling edge 604 with 3×U1 between the edges 602 and 604, the fourth square of the "number of UIs between" row of table 700 records a corresponding "3". This information may then be correlated to the data values in the data stream.

According to further embodiments, by using a local reference clock, the SerDes receiver may retrieve stored data signal edges from a FIFO buffer and re-assemble the edges based on their sequence received. The bit patterns may then be recovered and output for processing, e.g., as described with reference to FIG. 6.

SerDes receivers according to some embodiments are not dependent on the precise location of clock edges as conventional systems are, which serves as an advantage especially in networking and/or telecommunications, as the SerDes receivers are able to maintain functionality in environments with high degrees of waveform jitter. It should also be noted that the high degree of signal integrity previously required by conventional clock recovery systems is no longer necessary, especially on PCB traces. Furthermore, rising and falling edges of data signals are gradual rather than instantaneous (due to hardware), and thus allow for a greater degree of flexibility in edge detection.

Figure 8A:
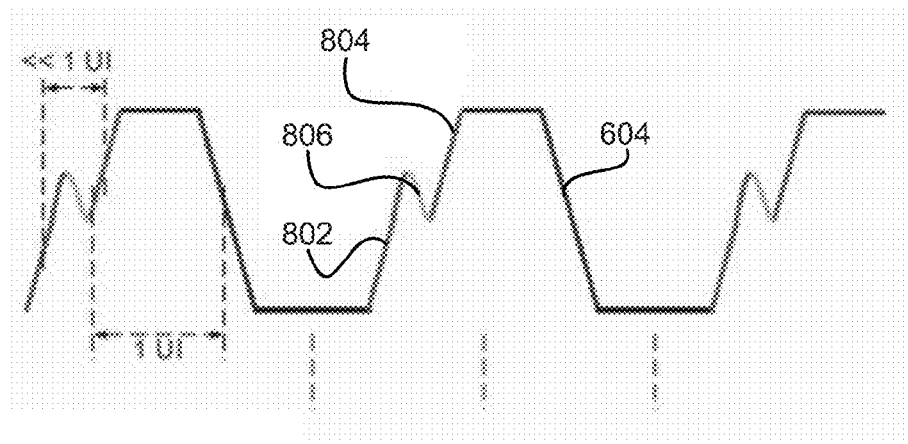
FIG. 8A illustrates a schematic view of waveform glitch of a rising edge according to one embodiment.

With reference to schematic 800 of FIG. 8A, a first rising edge 802 is followed by a second rising edge 804, within an interval of much less than 1×UI (hereafter referred to as <<×UI). A second rising edge 804 within an interval of <<1× UI from the first rising edge 802 may be caused by a waveform glitch 806, glitch, step, etc. of a single rising. Recall that an assumption is made that a rising edge will be followed by a falling edge, and vice versa, in normal serial communications in some embodiments. Thus a second edge of the same type detected within some portion of the interval (UI), e.g., less than 50% of the interval, may be ignored (ruled out to be a waveform glitch 806). It follows that a second rising edge 804 detected within an interval of <<1×UI of the first rising edge 802 may be deemed part of a single rising edge that includes both 802 and 804.

Figure 8B:
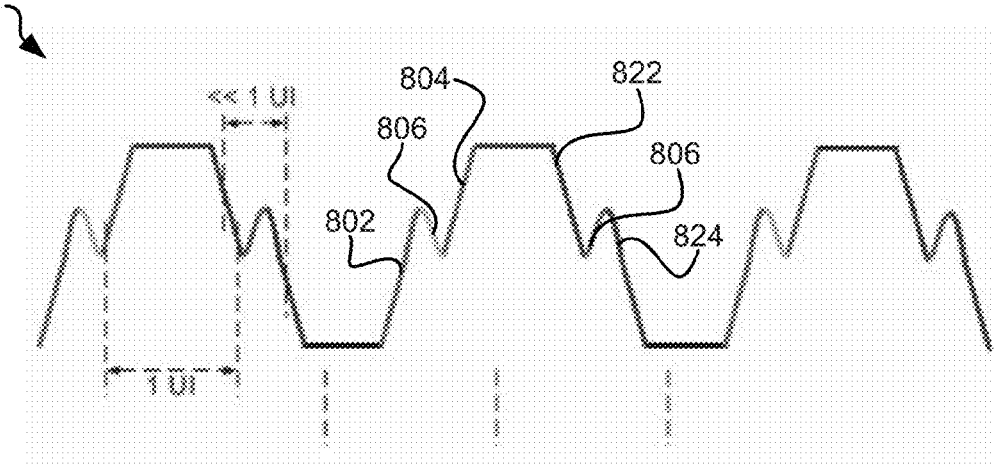
FIG. 8B illustrates a schematic view of waveform glitch of a falling edge according to one embodiment.

A waveform glitch 806 in a data signal edge may appear to be a portion of a first rising edge 802, or a portion of a first falling edge (see 822 of FIG. 8B). Referring now to FIG. 8B, schematic 820 includes an additional illustrative embodiment of a waveform glitch 806 that may be experienced in detection of data signal edges. Schematic 820 includes waveform glitch 806 on a first rising edge 802 and second rising edge 804, e.g., as illustrated and described in schematic 800. Additionally, schematic 820 includes waveform glitch 806 between a first falling edge 822 and a following second falling edge 824. As described in FIG. 8A, because a first falling edge 822 is followed by a second falling edge 824, within an interval of <<1×UI, the detection may be ruled as an error. Accordingly, a second falling edge 824 within an interval of <<1×UI from the first falling edge 822 may be counted as one falling edge, depending on the embodiment.

In further embodiments, if the time period between first rising edge 802 and a second rising edge 804, or a first falling edge 822 and a second falling edge 824 is greater than or equal to 1×UI (hereafter referred to as >=1×UI), it may indicate one or more missing bits or bit errors, whereupon a bit error recovery algorithm of a type known in the art may be invoked. Depending on the embodiment, the recovery algorithm may count the number of UI within the consecutive edges (falling or rising), in order to estimate the number of bit errors.

Figure 9:
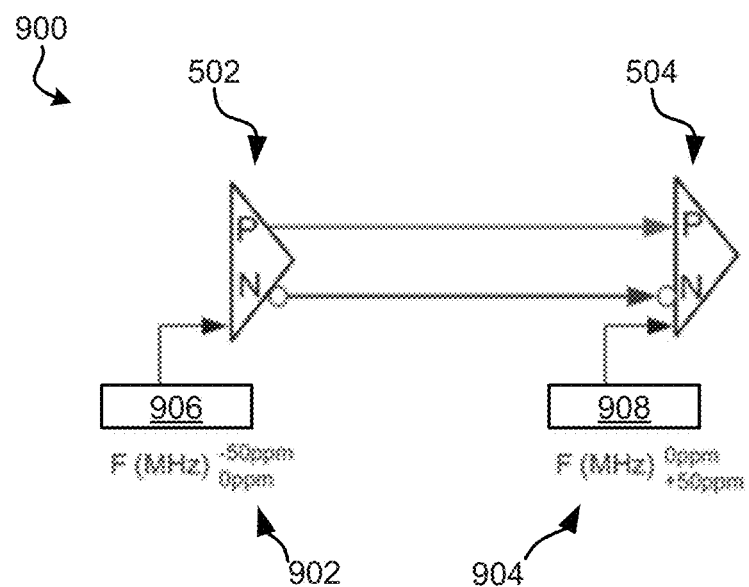
FIG. 9 illustrates a clock source configuration according to one embodiment.

FIG. 9 depicts a clock source configuration 900 in accordance with one embodiment. As an option, the present clock source configuration 900 may be implemented in conjunction with features from any other embodiment listed herein, such as those described with reference to the other FIGS. Of course, however, such clock source configuration 900 and others presented herein may be used in various applications and/or in permutations which may or may not be specifically described in the illustrative embodiments listed herein. Further, the clock source configuration 900 presented herein may be used in any desired environment.

Clock source configuration 900 of FIG. 9 includes SerDes transmitter portion 502 and SerDes receiver portion 504. Additionally, clock source configuration 520 includes transmitter reference clock 906 and receiver reference clock 908.

The transmitter portion frequency 902 is set to −50 ppm in the current embodiment while the receiver portion frequency 904 is set to +50 ppm but either value could be higher or lower depending on the embodiment. Differing transmitter portion frequencies 902 and receiver portion frequencies 904 may be set in order to prevent overflow of the SerDes receiver portion buffers. In a further approach, the receiver reference clock 908 may be set slightly faster than the transmitter reference clock 906 in order to prevent overflow of the SerDes receiver portion buffers. It should be noted that the receiver reference clock 908 is preferably set within the tolerances of the transmitter reference clock 906. According to a further embodiment, the receiver portion may use a digital Phase Lock Loop (PLL), in order to track the transmitter reference clock 906.

According to a further embodiment, in order to prevent overflow of the SerDes receiver portion buffers, the transmitter portion may use a frequency counter, and while initially establishing a link between the transmitter and receiver portions, provide the precision clock frequency to the receiver portion.

SerDes transmitters and receivers also provide extended transmission capabilities when compared to conventional clock recovery systems. They may further reduce the price of printed circuit boards (PCBs) by maintaining functionality when designed with lower performance PCB materials than a conventional clock recovery system would require.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
 receiving a serialized data stream;
 detecting rising and falling edges in the serialized data stream;
 correlating the rising and falling edges to data values using a clock signal that is not derived from the serialized data stream; and
 converting the serialized data stream to a parallel data stream.

2. The method of claim 1, wherein the clock signal is derived from a local clock.

3. The method of claim 1, wherein the clock signal is derived from a clock on a remote device sending the serialized data stream.

4. The method of claim 1, wherein the serialized data stream is received from a serial link having a differential pair.

5. The method of claim 1, wherein the correlating the rising and falling edges to data values using the clock signal includes determining a number of intervals between the detected edges, each interval corresponding to a predefined period derived from the clock signal.

6. The method of claim 5, wherein the types of edges and the number of intervals between the edges are stored in a table, the table being used to deserialize the data stream.

7. The method of claim 5, wherein a second edge of a same type detected within less than 50% of one interval is ignored.

8. The method of claim 5, invoking a bit error recovery algorithm when two consecutive edges of the same type are detected within greater than or equal to one interval.

9. A system, comprising:
 a processor and logic integrated with and/or executable by the processor, the logic being configured to:
 receive a serialized data stream;
 detect rising and falling edges in the serialized data stream;
 correlate the rising and falling edges to data values using a clock signal that is not derived from the serialized data stream; and
 convert the serialized data stream to a parallel data stream.

10. The system of claim 9, wherein the clock signal is derived from a local clock.

11. The system of claim 9, wherein the clock signal is derived from a clock on a remote device sending the serialized data stream.

12. The system of claim 9, wherein the serialized data stream is received from a serial link having a differential pair.

13. The system of claim 9, wherein the correlating the rising and falling edges to data values using the clock signal includes determining a number of intervals between the detected edges, each interval corresponding to a predefined period derived from clock signal.

14. The system of claim 13, wherein the types of edges and the number of intervals between the edges are stored in a table, the table being used to deserialize the data stream.

15. The system of claim 13, wherein a second edge of a same type is detected within less than 50% of one interval is ignored.

16. The system of claim 13, invoking a bit error recovery algorithm when two consecutive edges of the same type are detected within greater than or equal to one interval.

17. A computer program product, the computer program product comprising a computer readable storage medium having program instructions embodied therewith, the program instructions readable and or executable by a device to cause the device to perform a method comprising:
 receiving a serialized data stream;
 detecting rising and falling edges in the serialized data stream;
 correlating the rising and falling edges to data values using a clock signal that is not derived from the serialized data stream; and
 converting the serialized data stream to a parallel data stream.

18. The computer program product of claim 17, wherein the clock signal is derived from a local clock.

19. The computer program product of claim 17, wherein the clock signal is derived from a clock on a remote device sending the serialized data stream.

20. The computer program product of claim 17, wherein the serialized data stream is received from a serial link having a differential pair.

* * * * *